United States Patent [19]

Hatakeyama et al.

[11] Patent Number: 5,985,512
[45] Date of Patent: *Nov. 16, 1999

[54] CHEMICALLY AMPLIFIED POSITIVE RESIST COMPOSITIONS

[75] Inventors: Jun Hatakeyama; Shigehiro Nagura; Toshinobu Ishihara, all of Nakakubiki-gun, Japan

[73] Assignee: Shin-Etsu Chemical Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/831,750

[22] Filed: Apr. 1, 1997

[30] Foreign Application Priority Data

Apr. 8, 1996 [JP] Japan ................................ 8-111309

[51] Int. Cl.$^6$ ................................................. G03G 7/004
[52] U.S. Cl. ..................................... 430/270.1; 430/905
[58] Field of Search ........................ 430/270.1, 919, 430/920, 905

[56] References Cited

U.S. PATENT DOCUMENTS

| | | | |
|---|---|---|---|
| 5,556,734 | 9/1996 | Yamachika et al. | 430/270.1 |
| 5,580,695 | 12/1996 | Murata et al. | 430/270.1 |
| 5,658,706 | 8/1997 | NIki et al. | 430/270.1 |
| 5,693,452 | 12/1997 | Aoai et al. | 430/270.1 |
| 5,707,776 | 1/1998 | Kawabe et al. | 430/270.1 |
| 5,736,296 | 4/1998 | Sato et al. | 430/270.1 |
| 5,750,309 | 5/1998 | Hatakeyama et al. | 430/170 |

FOREIGN PATENT DOCUMENTS

| | | |
|---|---|---|
| 63-27829 | 2/1988 | Japan . |
| 63-149640 | 6/1988 | Japan . |
| 2-27660 | 6/1990 | Japan . |
| 5-127369 | 5/1993 | Japan . |
| 5-232706 | 9/1993 | Japan . |
| 5-249662 | 9/1993 | Japan . |
| 5-249683 | 9/1993 | Japan . |
| 5-257283 | 10/1993 | Japan . |
| 5-265213 | 10/1993 | Japan . |
| 5-289340 | 11/1993 | Japan . |
| 6-230574 | 8/1994 | Japan . |
| 6-242605 | 9/1994 | Japan . |
| 6-266110 | 9/1994 | Japan . |
| 6-266111 | 9/1994 | Japan . |
| 7-92678 | 4/1995 | Japan . |
| 7-92680 | 4/1995 | Japan . |
| 7-92681 | 4/1995 | Japan . |
| 7-118651 | 5/1995 | Japan . |
| 7-120929 | 5/1995 | Japan . |
| 7-128859 | 5/1995 | Japan . |
| 7-134419 | 5/1995 | Japan . |
| 7-209868 | 8/1995 | Japan . |

OTHER PUBLICATIONS

English abstract of JP–A 265213/93.

*Primary Examiner*—John S. Chu
*Attorney, Agent, or Firm*—Millen, White, Zelano, & Branigan, P.C.

[57] ABSTRACT

A chemically amplified positive resist composition is prepared by blending (A) an organic solvent, (B) a base resin, and (C) a photoacid generator with a mixture of (1) a nitrogenous organic compound having pKa$\geq$7 and a vapor pressure of less than 2 Torr at 100° C. and (2) a nitrogenous organic compound having pKa$\geq$7 and a vapor pressure of 2–100 Torr at 100° C. The resist composition has high sensitivity to actinic radiation and high resolution, is developable with aqueous base to form a pattern without a T-top profile by PED and footing on the substrate surface, and is suitable for fine processing.

15 Claims, No Drawings

CHEMICALLY AMPLIFIED POSITIVE RESIST COMPOSITIONS

BACKGROUND OF THE INVENTION

1. Field of the Invention

This invention relates to a chemically amplified positive resist composition which is highly sensitive to actinic radiation such as deep-UV, electron beam and X-ray, developable with aqueous base to form a pattern, and suitable for fine processing.

2. Prior Art

Resist materials are widely used in processes for the manufacture of semiconductor devices such as ICs an LSIs. To comply with the recent development toward higher integration and higher speed, further refinement of pattern rules is required. Deep-UV lithography is capable of working on the order of 0.3 or 0.4 μm and makes it possible to form a resist pattern having a side wall nearly perpendicular to the substrate if a less light absorbing resist material is used.

Advanced engineers place focus on the utilization of high illuminance KrF excimer laser as a deep-UV source. A resist material having low light absorption and high sensitivity must be developed before such an excimer laser can be used in a mass scale manufacturing technique.

In this respect, recently developed chemical amplification positive resist materials using acid catalysts as disclosed in JP-B 27660/1990, JP-A 27829/1988, U.S. Pat. Nos. 4,491,628 and 5,310,619 are regarded promising as resist materials especially suited for deep-UV lithography because these materials have relatively high sensitivity, resolution and dry etching resistance and can utilize a high illuminance KrF excimer laser as a deep-UV source.

Chemically amplified positive resist materials suffer from a post-exposure delay (PED) problem and a footing phenomenon. The PED problem is that in lithographic process, line patterns would have a T-top profile, that is, patterns become thick at the top if the leave-to-stand or delay time from exposure to post-exposure baking (PEB) is extended. The footing is a phenomenon that a pattern on a silicon or titanium nitride substrate becomes widened in proximity to the substrate. It is believed that the T-top profile arises because the solubility of resist film is reduced in proximity to its surface whereas the footing arises because the solubility of resist film-is reduced in proximity to the substrate. There also occurs a problem that dark reaction of eliminating an acid labile group proceeds in a PED duration from exposure to PEB, reducing the dimension of a line to be left. These problems are serious enough to prevent chemically amplified positive resist materials from practical application.

Moreover, these problems not only complicate dimensional control in the lithographic process, but also adversely affect dimensional control in the processing of substrates using dry etching. In this regard, reference is made to W. Hinsberg et al., J. Photopolym. Sci. Technol., 6 (4), 535–546 (1993) and T. Kumada et al., J. Photopolym., Sci. Technol., 6 (4), 571–574 (1993).

It is understood that in these chemically amplified positive resist materials, air-borne basic compounds largely participate in the PED or T-top profile problem and basic compounds on the substrate surface largely participate in the footing phenomenon. Light exposure generates acid at the resist surface which is deactivated through reaction with air-borne basic compounds. As the leave-to-stand or delay time from exposure to PEB is extended, the amount of thus deactivated acid increases to retard decomposition of the acid labile group. An insolubilized layer is then formed at the resist surface, resulting in a T-top profile.

Regarding a photosensitive lithographic printing plate, JP-A 149640/1988 proposes to add an amine compound capable of capturing the acid generated upon exposure to actinic radiation, for stabilizing the sensitivity of the plate after exposure. The amine compounds used therein are 4-dimethylaminopyridine, p-phenylenediamine, and p-amino-benzoic acid. Addition of these amine compounds, however, is not effective for increasing resolution.

It is also proposed to blend nitrogenous basic compounds in chemically amplified positive resist materials to buffer the influence of contamination with basic compounds from the ambient atmosphere for thereby restraining development of an insolubilized surface layer on a resist pattern. This method, however, undesirably invites a drop of resolving power.

It is also proposed to add nitrogenous basic compounds to chemically amplified positive resist materials for capturing the acid which would otherwise diffuse into unexposed areas, thereby restraining a dimensional variation of a resist pattern. See JP-A 127369/1993, 232706/1993, 249662/1993, 249683/1993, 257283/1993, 289340/1993, 242605/1994, 266110/1994, 266111/1994, 92678/1995, 92680/1995, 92681/1995, 120929/1995, 128859/1995, 134419/1995, and 209868/1995. There is a desire to have a chemically amplified positive resist material of better quality.

SUMMARY OF THE INVENTION

Therefore, an object of the present invention is to provide a chemically amplified positive resist composition which has high sensitivity to actinic radiation such as deep-UV, electron beam and X-ray and high resolution, is developable with aqueous base to form a resist pattern and lends itself to a fine processing technique.

In conjunction with a chemically amplified positive resist composition comprising an organic solvent, a base resin, a photoacid generator and optional components, we have found that by blending therein a mixture of (1) a nitrogenous organic compound having at least pKa 7 and a vapor pressure of less than 2 Torr at 100° C. and (2) a nitrogenous organic compound having at least pKa 7 and a vapor pressure of 2 to 100 Torr at 100° C., there is obtained a chemically amplified positive resist composition featuring high resolution.

More particularly, according to the invention, using a strongly basic nitrogenous organic compound which is evenly dispersible in a resist film in combination with another strongly basic nitrogenous organic compound which is dispersed in such a graded concentration that it is lean near the top of the resist film, there is obtained a chemically amplified positive resist composition which has high resolution capacity and has eliminated the problems of T-top profile of a resist pattern caused by PED and footing at the substrate surface.

When a strongly basic nitrogenous organic compound having at least pKa 7 is added to a resist composition, the compound captures the acid generated by radiation such as slightly diffracted light in unexposed areas for thereby restraining thinning of the resist film in unexposed areas and increasing resolution. This is supported by the fact that the nitrogenous organic compound is effective for increasing the gradient at which the dissolution rate of exposed areas of a resist in a developer increases with an increase of exposure dose, that is, the solubility curve. It was found that the influence on resolution improvement varies with a particular type of strongly basic nitrogenous organic compound having at least pKa 7. A resist composition having added thereto a strongly basic nitrogenous organic compound having a vapor pressure of less than 2 Torr at 100° C. shows resolution instability in that it is somewhat improved in resolution, but is susceptible to contamination with ammonia and amines in the ambient gas and tends to form a T-top profile by PED. In contrast, a resist composition having added thereto a strongly basic nitrogenous organic compound having a vapor pressure of 2 to 100 Torr at 100° C. shows unsatisfactory resolving ability in that it is somewhat improved in resolution, but forms a forward tapered line pattern profile. The following facts were revealed when a dissolution rate of an exposed area of a resist film was measured. In the former case, the dissolution rate at the uppermost position of a nodal portion of a standing wave developed in a resist film is extremely low as compared with the remaining portion, which arises from high susceptibility to external influence. In the latter case, the dissolution rate of a resist film portion near the substrate surface is low so that the line pattern profile becomes forward tapered, failing to provide fully satisfactory resolving ability.

Under such circumstances, quite unexpectedly, we have found that when the above-mentioned two types of strongly basic nitrogenous organic compounds are used together, (a) there disappears the portion where the dissolution rate at the uppermost position of a nodal portion of a standing wave developed in a resist film is extremely low and (b) the dissolution rate of a portion near the substrate surface is accelerated. A chemically amplified positive resist composition containing a mixture of such two types of strongly basic nitrogenous organic compounds has significantly improved resolution ability. This is because a strongly basic nitrogenous organic compound having a vapor pressure of less than 2 Torr at 100° C. remains relatively evenly distributed in a resist film after a resist composition is coated and prebaked to volatilize off the resist solvent, and because a strongly basic nitrogenous organic compound having a vapor pressure of 2 to 100 Torr at 100° C. is distributed in a resist film in such a graded concentration that it is lean in a resist surface layer. By the combined use of two types of compounds having different concentration distribution, an appropriate concentration distribution of strongly basic nitrogenous organic compounds is created within a resist film.

Therefore, a chemically amplified positive resist composition comprising both (1) at least one nitrogenous organic compound having at least pKa 7 and a vapor pressure of less than 2 Torr at 100° C. and (2) at least one nitrogenous organic compound having at least pKa 7 and a vapor pressure of 2 to 100 Torr at 100° C. has significantly improved resolution characteristics and has overcome the problems of a T-top profile of a resist pattern by PED and footing at the substrate surface.

Accordingly, the present invention provides a chemically amplified positive resist composition comprising (1) at least one nitrogenous (or nitrogen-containing) organic compound having a pKa value of at least 7 and a vapor pressure of less than 2 Torr at 100° C. and (2) at least one nitrogenous organic compound having a pKa value of at least 7 and a vapor pressure of 2 to 100 Torr at 100° C.

In another aspect, the present invention provides a chemically amplified positive resist composition comprising (A) an organic solvent, (B) a base resin, (C) a photoacid generator, and (D) a mixture of nitrogenous organic compounds (1) and (2).

DESCRIPTION OF THE PREFERRED EMBODIMENTS

According to the present invention, the chemically amplified positive resist composition contains (1) at least one nitrogenous organic compound having a pKa value of at least 7 and a vapor pressure of less than 2 Torr at 100° C. and (2) at least one nitrogenous organic compound having a pKa value of at least 7 and a vapor pressure of 2 to 100 Torr at 100° C.

Component (1) is a nitrogenous organic compound having a pKa value of at least 7, preferably 7.5 to 13 and a vapor pressure of less than 2 Torr, preferably 0 to 1.5 Torr at 100° C. Examples of the nitrogenous organic compound meeting these requirements include 1,8-azabicycloundecene, triethanolamine, 1-naphthylamine, 2-naphthylamine, diphenylamine, acetanilide, 3,6,9-triazaundecamethylenediamine, and 4,4'-propane-1,3-diylbismorpholine, with the 1,8-azabicycloundecene and triethanolamine being preferred. These compounds may be used alone or in admixture of two or more.

Nitrogenous organic compound (1) is preferably blended in an amount of 0.05 to 0.5 mol, especially 0.1 to 0.5 mol per mol of the photoacid generator to be described later. On this basis, less than 0.05 mol of the nitrogenous organic compound would not be effective for improving resolution whereas more than 0.5 mol would invite sensitivity lowering and induce larger standing waves.

Component (2) is a nitrogenous organic compound having a pKa value of at least 7, preferably 7.5 to 13 and a vapor pressure of 2 to 100 Torr, preferably 2 to 50 Torr at 100° C. Examples of the nitrogenous organic compound meeting these requirements include quinoline, methylquinoline, dimethylquinoline, trimethylquinoline, tri-n-butylamine, triisobutylamine, trihexylamine, piperidine-ethanol, toluidine, 1,5-diazabicyclononene, benzenediamine, phenylpiperadine, indole, benzynepyrridine, dimethyltriazole, nitrophenol, diethanolamine, ethylanthranylate, dibutylethylenediamine, dimethylphenylenediamine, triethylenetetramine, iminodiethanol, ethoxyaniline, and phenylpropylhydrazine, with quinoline, piperidine-ethanol, and tributylamine being preferred. These compounds may be used alone or in admixture of two or more.

Nitrogenous organic compound (2) is preferably blended in an amount of 0.01 to 1 mol, especially 0.05 to 0.5 mol per mol of the photoacid generator to be described later. On this basis, less than 0.01 mol of the nitrogenous organic compound would not be effective for improving PED stability whereas more than 1 mol would invite a sensitivity drop and forward tapered profile.

Nitrogenous organic compounds (1) and (2) are preferably blended in a molar ratio of from 1:0.01 to 1:5 although the exact ratio may be appropriately selected in accordance with the properties of these compounds.

The chemically amplified positive resist composition of the invention is prepared by blending (A) an organic solvent, (B) a base resin, (C) a photoacid generator, (D) a mixture of nitrogenous organic compounds (1) and (2) defined above, and optionally, (E) a dissolution rate regulator.

The organic solvent (A) may be any desired one of organic solvents in which the base resin, photoacid generator, nitrogenous compounds, and dissolution inhibitor are soluble. Exemplary organic solvents include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, and ethyl 3-ethoxypropionate alone or in admixture of two or more. Among these organic solvents, diethylene glycol dimethyl ether, 1-ethoxy-2-propanol, and propylene glycol monomethyl ether acetate are preferred because the photoacid generator is most soluble therein.

The amount of the organic solvent used is generally about 200 to 1,000 parts, preferably about 400 to 800 parts by weight per 100 parts by weight of the base resin. Compositions with less than 200 parts of the solvent would somewhat lack mutual miscibility of the components and film formability. Compositions with more than 1,000 parts of the solvent would form too thin films.

The base resin (B) is a polymer having recurring units as shown by the following general formula (1).

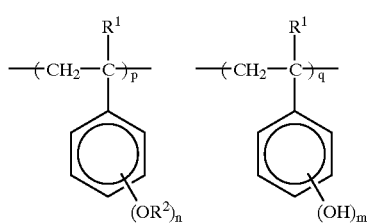

(1)

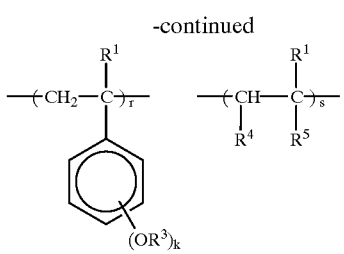

-continued

In formula (1), $R^1$ is independently a hydrogen atom or methyl group, $R^2$ is a hydrogen atom or acid labile group, at least one $R^2$ being hydrogen and at least one $R^2$ being an acid labile group, $R^3$ is an acid labile group, $R^4$ is a hydrogen atom, and $R^5$ is —COOX or

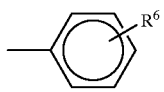

wherein X is a hydrogen atom or an acid labile group and $R^6$ is a hydrogen atom or an alkyl group having 1 to 6 carbon atoms such as methyl, ethyl, propyl and butyl groups. Alternatively, $R^4$ and $R^5$, taken together, may form

The units of formula (1) of which a polymer is composed may be the same or different. Letter n is equal to 2 or 3, and each of m and k is equal to 1, 2 or 3. Letters p, q, r and s are 0 or a positive number with the proviso that p+q≠0 and p+r≠0. The percent partial replacement of the hydrogen atom of a phenolic hydroxyl group by an acid labile group is preferably from 5% to 80%. The sum of p+q+r+s is such a number that the polymer may have a weight-average molecular weight as will be defined later.

In formula (1), the acid labile group is selected from various such groups, especially groups of formulae (2) and (3), linear, branched or cyclic alkyl groups having 1 to 6 carbon atoms, tetrahydropyranyl, tetrahydrofuranyl, and trialkylsilyl groups.

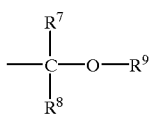

(2)

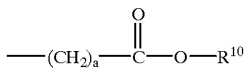

(3)

In formulae (2) and (3), $R^7$ and $R^8$ are independently a hydrogen atom or normal or branched alkyl group having 1 to 6 carbon atoms, and $R^9$ is a normal, branched or cyclic alkyl group having 1 to 10 carbon atoms, and $R^{10}$ is a normal, branched or cyclic alkyl group having 1 to 6 carbon atoms, and letter a is equal to 0 or 1. Examples of the normal or branched alkyl group include methyl, ethyl, propyl, isopropyl, n-butyl, isobutyl, and tert-butyl groups. Cyclohexyl is exemplary of the cyclic alkyl group.

Examples of the acid labile group of formula (2) include methoxyethyl, ethoxyethyl, n-propoxyethyl, isopropoxyethyl, n-butoxyethyl, isobutoxyethyl, tert-butoxyethyl, cyclohexyloxyethyl, methoxypropyl, ethoxypropyl, 1-methoxy-1-methylethyl, and 1-ethoxy-1-methylethyl groups. Examples of the acid labile group of formula (3) include tert-butoxycarbonyl and tert-butoxycarbonylmethyl groups. Examples of the trialkylsilyl group include those having a $C_1$–$C_6$ alkyl group, such as trimethylsilyl and tri-tert-butyldimethylsilyl groups.

With respect to the two types of acid labile groups in the polymer of formula (1), a choice is preferably made among the above-mentioned groups such that $R^2$ is an alkoxyalkyl group of formula (2) and $R^3$ is a tert-butoxycarbonyl group, particularly when characteristics of a resist composition having an inventive polymer blended as a base resin are taken into account.

In formula (1), letter n is equal to 2 or 3. Since decomposition of acid labile groups yields hydroxyl groups, a choice of n to be equal to 2 or 3 suggests that as the number of hydroxyl groups increases to 2 or 3, acidity increases to enable control of an alkali dissolution rate. Each of m and k is equal to 1, 2 or 3, preferably 1 or 2 for ease of synthesis and control of an alkali dissolution rate.

Letters p, q, r, and s are 0 or positive numbers, preferably $0 \leq p/(p+q+r+s) \leq 0.9$, $0 \leq q/(p+q+r+s) \leq 0.9$, $0 \leq r/(p+q+r+s) \leq 0.8$, and $0 \leq s/(p+q+r+s) \leq 0.5$, more preferably $0 \leq p/(p+q+r+s) \leq 0.7$, $0 \leq q/(p+q+r+s) \leq 0.7$, $0 \leq r/(p+q+r+s) \leq 0.5$, and $0 \leq s/(p+q+r+s) \leq 0.3$, with the proviso that $p+q \neq 0$ and $p+r \neq 0$. The percent partial replacement of the hydrogen atom of a phenolic hydroxyl group by an acid labile group is preferably from 5% to 80%, especially 10% to 40%. The sum of p+q+r+s is such a number that the polymer may have a weight-average molecular weight as will be defined later. If the percent partial replacement of the hydrogen atom of a phenolic hydroxyl group by an acid labile group is less than 5%, then the contrast of alkali dissolution rate is reduced and resolution is exacerbated. If the same is more than 80%, then a polymer has a low glass transition temperature and poor heat resistance, and a coating thereof experiences a thickness change, induces internal stresses, generates bubbles upon alkali development, and provides a weak bond to the substrate because of less hydrophilic groups.

In the polymer used as a base resin, the content of the acid labile groups affects the contrast of dissolution rate of a resist coating and governs the characteristics of a resist composition including pattern size and shape.

The polymer of formula (1) should preferably have a weight-average molecular weight (Mw) of 3,000 to 300,000, more preferably 3,000 to 30,000. With Mw<3,000, a resist composition is less resistant to heat. With Mw>300,000, a resist composition becomes low in alkali dissolution and tends to give rise to a footing phenomenon after pattern formation.

In the base resin according to the present invention, a wide molecular weight dispersity (Mw/Mn) means that there are present low molecular weight polymers and high molecular weight polymers. If low molecular weight polymers are predominant, heat resistance would be poor. If high molecular weight polymers are predominant, which means the presence of less alkali soluble components, a footing phenomenon occurs after pattern formation. As the pattern rule becomes finer, the influence of molecular weight and its dispersity becomes more significant. In order to provide a resist composition suitable for processing to fine pattern dimensions, the base resin is preferably a monodisperse polymer having a dispersity of 1.0 to 1.5, especially 1.0 to 1.3.

The photoacid generator (C) which generates an acid upon exposure to radiation includes, for example, onium salts, sulfonates, halogenated compounds and triazine compounds. Since the base resin tends to have a low glass transition temperature (Tg) when it contains an alkoxyalkyl group or the like, onium salts featuring efficient acid generation and enhanced dissolution inhibition are preferred in order to avoid such tendency. Preferred examples of the onium salt include triphenylsulfonium trifluoromethanesulfonate derivatives and triphenylsulfonium p-toluenesulfonate derivatives, though not limited thereto. Preferred examples of the sulfonate include alkylsulfonate derivatives and azidosulfonate derivatives, though not limited thereto.

The photoacid generators may be used alone or in admixture of two or more. The amount of the acid generator used is generally about 1 to 20 parts, preferably about 2 to 10 parts by weight per 100 parts by weight of the alkali soluble resin.

Component (D) blended in the chemically amplified positive resist composition according to the invention is a mixture of nitrogenous organic compounds (1) and (2) defined previously.

The resist composition of the invention may have further blended therein a dissolution rate regulator (E). One typical dissolution rate regulator is a compound having a molecular weight of 100 to 1,000 and at least two phenolic hydroxyl groups in a molecule, the hydrogen atom of the phenolic hydroxyl group being replaced by an acid labile group in an average proportion of 10% to 100% of the entire phenolic hydroxyl groups. Examples of the compound having at least two phenolic hydroxyl groups are shown below by formulae (4) through (14).

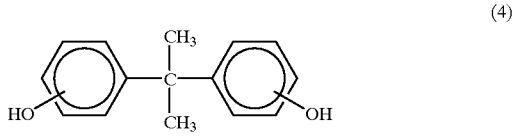

(4)

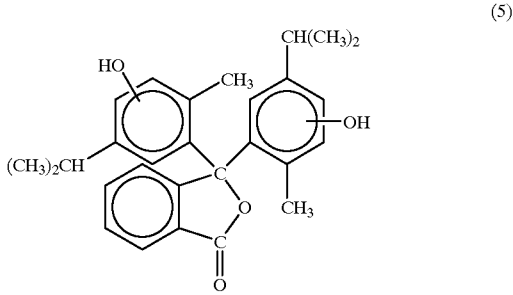

(5)

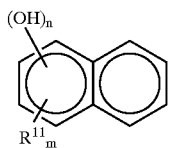
(6)

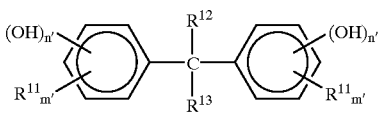
(7)

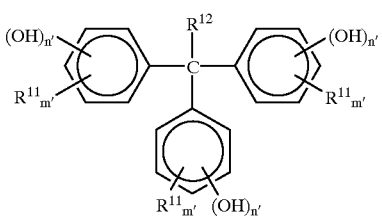
(8)

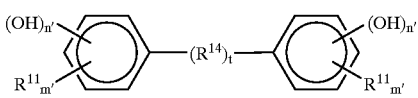
(9)

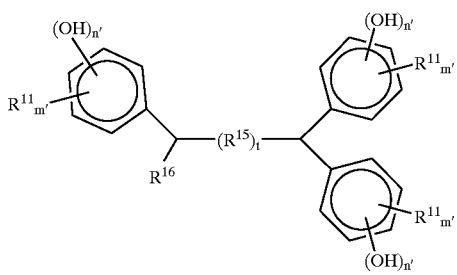
(10)

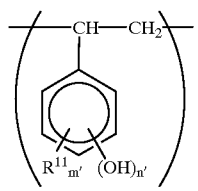
(11)

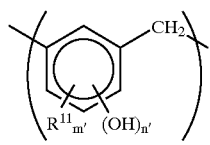
(12)

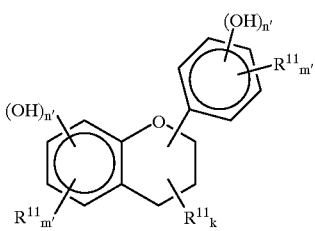
(13)

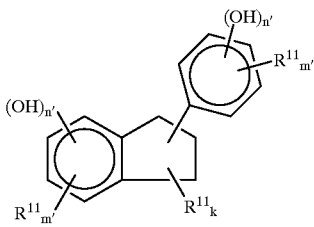
(14)

In the formulae, $R^{11}$ and $R^{12}$ are independently a hydrogen atom or normal or branched alkyl or alkenyl group having 1 to 8 carbon atoms, $R^{13}$ is a hydrogen atom, normal or branched alkyl or alkenyl group having 1 to 8 carbon atoms, or —$(R^{17})_t$—COOH, each of $R^{14}$ and $R^{15}$ is an alkylene group having 1 to 10 carbon atoms, arylene group having 6 to 10 carbon atoms, carbonyl group, sulfonyl group, oxygen atom or sulfur atom, $R^{16}$ is a hydrogen atom, normal or branched alkyl or alkenyl group having 1 to 8 carbon atoms, hydroxyl-substituted phenyl or naphthyl group, $R^{17}$ is a normal or branched alkylene group having 1 to 10 carbon atoms, letter k is an integer of 0 to 3, t is 0 or 1, and m, n, m', n', m", and n" are numbers satisfying m+n=8, m'+n'=5, and m"+n"=4 such that at least one hydroxyl group is attached to each phenyl skeleton.

Exemplary groups represented by $R^{11}$ and $R^{12}$ are hydrogen, methyl, ethyl, propyl, butyl, ethynyl, and cyclohexyl groups. Exemplary groups represented by $R^{13}$ are hydrogen, methyl, ethyl, propyl, butyl, and cyclohexyl as well as —COOH and —CH$_2$COOH. Exemplary groups represented by $R^{14}$ and $R^{15}$ are methylene, ethylene, phenylene, carbonyl, and sulfonyl groups, oxygen and sulfur atoms. Exemplary groups represented by $R^{16}$ are hydrogen, methyl, ethyl, propyl, butyl, ethynyl, cyclohexyl, and hydroxyl-substituted phenyl and naphthyl groups.

The acid labile group in the dissolution rate regulator includes groups of formulae (2) and (3), tert-butyl, tetrahydropyranyl, tetrahydrofuranyl, trialkylsilyl, and β-ketoalkyl groups.

The dissolution rate regulator in the form of a compound having a phenolic hydroxyl group partially replaced by an acid labile group is preferably blended in the resist composition in an amount of 0 to about 50 parts, more preferably 0 to about 30 parts, most preferably about 1 to 30 parts by weight per 100 parts by weight of the base resin. More than 50 parts of the dissolution rate regulator would cause thinning of a resist pattern and detract from resolution. The dissolution rate regulators may be used alone or in admixture of two or more.

The dissolution rate regulator mentioned just above may be synthesized by chemically reacting a compound having a phenolic hydroxyl group with an acid labile group by the same method as used in introducing an acid labile group into the aforementioned polymer.

Instead of or in addition to the dissolution rate regulator (E) mentioned above, the resist composition of the invention may contain (F) another dissolution rate regulator in the form of a compound having a weight-average molecular weight of more than 1,000 to 3,000 and a phenolic hydroxyl group in a molecule, the hydrogen atom of the phenolic hydroxyl group being partially replaced by an acid labile group in an average proportion of more than 0% to 60% of the entire phenolic hydroxyl groups.

The compound wherein the hydrogen atom of a phenolic hydroxyl group is partially replaced by an acid labile group is preferably selected from those compounds having recurring units of the following general formula (15) and a weight-average molecular weight of more than 1,000 to 3,000.

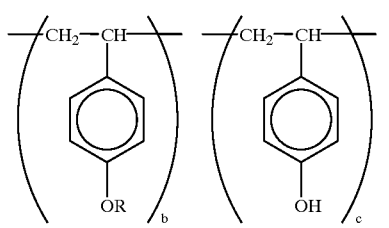

(15)

In the formula, R is an acid labile group, letters b and c are numbers satisfying $0 < b/(b+c) \leq 0.6$.

The acid labile group in the dissolution rate regulator (F) includes alkoxyalkyl groups of formula (2), carbonyl-bearing groups of formula (3), tert-butyl, tetrahydropyranyl, triallylsilyl, and β-ketoalkyl groups.

The dissolution rate regulator (F) is preferably blended in the resist composition in an amount of 0 to about 50 parts, more preferably 0 to about 30 parts, most preferably about 1 to 30 parts by weight per 100 parts by weight of the base resin. The indicated amount is a combined amount of dissolution rate regulators (E) and (F) when both are used together.

Also the dissolution rate regulator (F) may be synthesized by chemically reacting a compound having a phenolic hydroxyl group with an acid labile group by the same method as used in introducing an acid labile group into the aforementioned polymer.

When dissolution rate regulator (E) and/or (F) is blended in resist material, the resist coating is increased in dissolution contrast, especially dissolution rate after exposure. Since the dissolution rate regulator is well compatible with the base resin of formula (1) and photoacid generator, it functions to increase the dispersion of the photoacid generator, increase the density of the matrix, and achieve microscopically uniform and controlled migration of an acid generated after exposure, resulting in improved resolution and rectangularity. In a patterning process including exposure, heating and development, the alkali soluble resin as the matrix in the unexposed area is suppressed in dissolution rate. In the exposed area, the alkali soluble resin as the matrix is accelerated in dissolution rate in aqueous base solution because of decomposition of its acid labile group. Thus the aqueous base solution greatly penetrates into the resist coating so that the dissolution rate regulator is quickly dissolved whereby blocks of the still undissolved alkali soluble resin are released into the aqueous base solution. This results in a quick increase of apparent alkali dissolution.

Especially when dissolution rate regulator (E) and higher molecular weight dissolution rate regulator (F) are blended together, there are obtained advantages that the base resin is densified to further enhance dissolution contrast, and that migration of acid generated after exposure is controlled so as to improve resolution and rectangularity after pattern formation.

As understood from the foregoing, a chemically amplified positive resist composition using a high molecular weight compound of the general formula (1) as the base resin and having blended dissolution rate regulator (E) and/or (F) seldom raises such problems as T-top profile, pattern thinning, and less heat resistance and as a consequence, has high sensitivity and high resolution and offers improved process adaptability in that the dimensions and shape of a pattern can be controlled in accordance with the formulation of the composition.

The resist composition of the invention may further contain various additives, for example, a surface-active agent for facilitating coating and a light-absorbing agent for reducing irregular reflection from the substrate. The amounts of such optional additives blended are conventional insofar as the objects of the invention are not impaired. Examples of the surfactant include perfluoroalkylpolyoxyethylene ethanols, fluorinated alkyl esters, perfluoroalkylamine oxides, and perfluoroalkyl EO addition products. Examples of the light-absorbing agent include diaryl sulfoxides, diaryl sulfones, 9,10-dimethylanthracene, and 9-fluorenone.

Any well-known lithography may be used to form a resist pattern from a positive resist composition of the invention. For example, the resist composition is spin coated onto a silicon wafer, prebaked at 80 to 120° C. to form a resist film of 0.5 to 2.0 μm thick, exposed to actinic radiation such as deep-UV, electron beam, and X-ray, and baked at 70 to 120° C. for 30 to 200 seconds (post-exposure baking=PEB), and developed with an aqueous base solution. The resist composition of the invention is especially suitable for fine patterning with deep-UV radiation of 254 to 193 nm and electron beams.

There has been described a chemically amplified positive resist composition which is highly sensitive to actinic radiation such as deep-ultraviolet radiation, electron beam and X-ray, especially KrF excimer laser light, and has overcome the problem of resolution instability by PED which is a common drawback of conventional chemically amplified positive resist materials. The inventive resist composition has improved sensitivity, resolution and plasma etching resistance. The resulting resist pattern is fully resistant to heat. The resist composition has high resolution enough to lend itself to fine patterning and is thus fully practical.

EXAMPLE

Examples of the present invention are given below by way of illustration and not by way of limitation. All parts are by weight.

Examples 1–23 & Comparative Examples 1–7

Liquid resist compositions were prepared by dissolving a base resin, a photoacid generator, a dissolution rate regulator, and nitrogenous organic compounds in a solvent in accordance with the formulation shown in Tables 2 to 4. Note that the composition further contained 0.05% by weight based on the entire system of a surfactant. Each of the compositions was passed through a 0.1-μm Teflon® filter.

The base resins used were polymers designated Polym.1 to Polym.9.

The photoacid generators used were PAG.1 to PAG.9.

The dissolution rate regulators used were compounds designated DRR.1 to DRR.5, DRR.1', and DRR.2'. These compounds are shown below by structural formulae.

The nitrogenous organic compounds used were selected from nitrogenous organic compounds (a-1) to (a-3) having at least pKa 7 and a vapor pressure of less than 2 Torr at 100° C. and nitrogenous organic compounds (b-1) to (b-5) having at least pKa 7 and a vapor pressure of 2 to 100 Torr at 100° C. as shown in Table 1.

The solvents used were propylene glycol monomethyl ether acetate (PGMEA) and a mixture of ethyl lactate/butyl acetate (EL/BA).

For comparison purposes, liquid resist compositions were similarly prepared as shown in Table 5, using a nitrogenous organic compound having at least pKa 7 and a vapor pressure of less than 2 Torr at 100° C. alone, a nitrogenous organic compound having at least pKa 7 and a vapor pressure of 2 to 100 Torr at 100° C. alone, and nitrogenous organic compounds (c-1) to (c-3) having a pKa value of less than 7.

Each liquid resist composition was then spin coated onto a silicon wafer to form a coating of 0.8 μm thick. With the silicon wafer rested on a hot plate at 100° C., the coating was pre-baked for 120 seconds. The film was exposed to a pattern of light by means of an excimer laser stepper model NSR-2005EX8A (manufactured by Nikon K.K., numerical aperture NA=0.5), baked at 90° C. for 60 seconds, and developed with an aqueous solution of 2.38% tetramethylammonium hydroxide, obtaining a positive pattern.

The resulting resist pattern was evaluated as follows. First, a sensitivity (Eth value) was determined. Provided that the exposure dose with which the top and bottom of a 0.35-μm line-and-space pattern were resolved at 1:1 was the optimum exposure (sensitivity Eop), the minimum line width of a line-and-space pattern which was recognized separate at this exposure dose was the resolution of a test resist. The configuration of the resist pattern resolved was observed under a scanning electron microscope.

After exposure, the resist film was allowed to stand in an environment of 200 ppb ammonia for 60 minutes. A 0.26-μm line-and-space pattern was observed for shape change.

The results are shown in Tables 2 to 5.

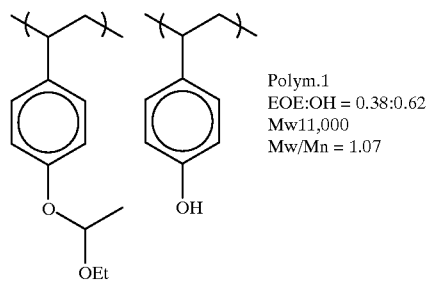

Polym.1
EOE:OH = 0.38:0.62
Mw 11,000
Mw/Mn = 1.07

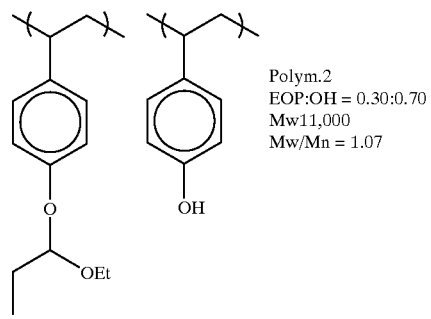

Polym.2
EOP:OH = 0.30:0.70
Mw 11,000
Mw/Mn = 1.07

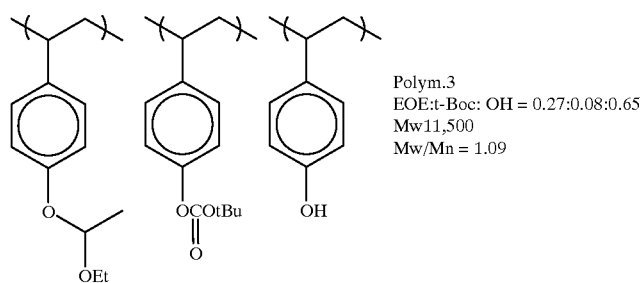

Polym.3
EOE:t-Boc: OH = 0.27:0.08:0.65
Mw 11,500
Mw/Mn = 1.09

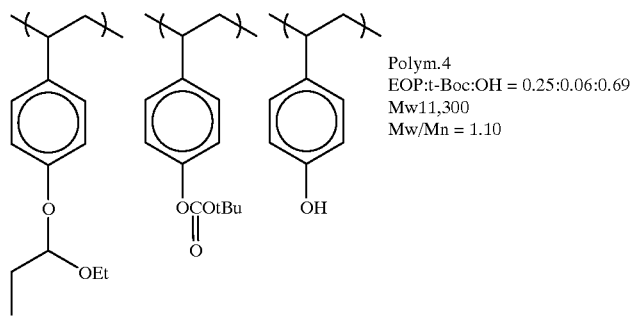

Polym.4
EOP:t-Boc:OH = 0.25:0.06:0.69
Mw 11,300
Mw/Mn = 1.10

-continued
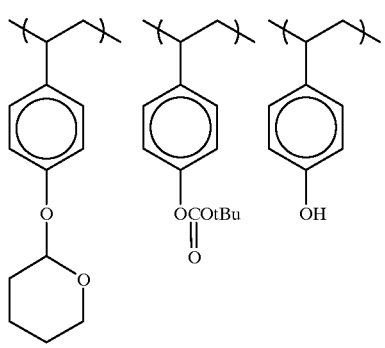
Polym.5
TMP:t-Boc:OH = 0.25:0.06:0.69
Mw 11,600
Mw/Mn = 1.11
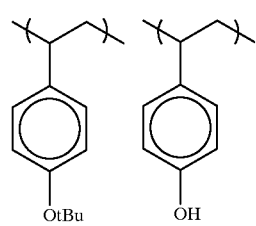
Polym.6
t-Bu:OH = 0.32:0.68
Mw 12,000
Mw/Mn = 1.08
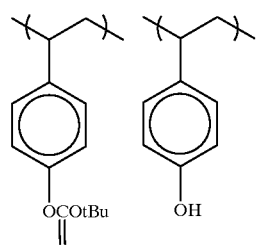
Polym.7
t-Boc:OH = 0.15:0.85
Mw 11,000
Mw/Mn = 1.08
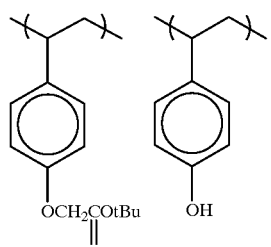
Polym.8
t-Bu-ester:OH = 0.15:0.85
Mw 11,800
Mw/Mn = 1.09
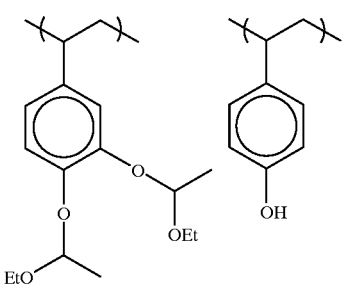
Polym.9
EOE:OH = 0.35:0.65
Mw 12,000
Mw/Mn = 1.10
PAG.1
PAG.2
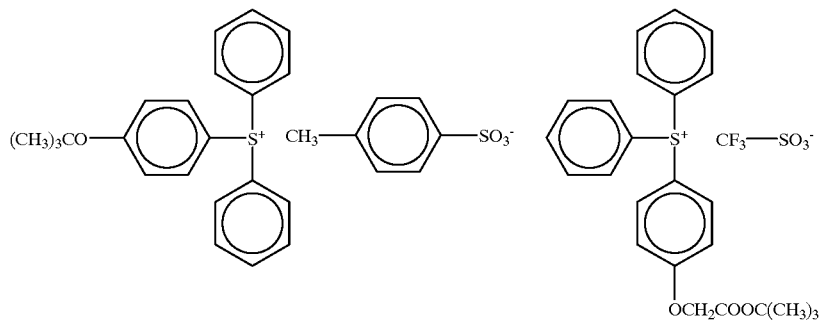
PAG.3
PAG.4
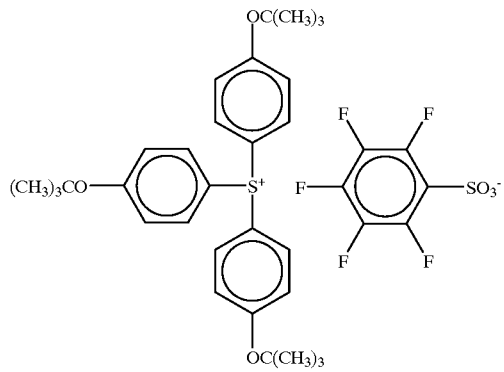

-continued
PAG.5
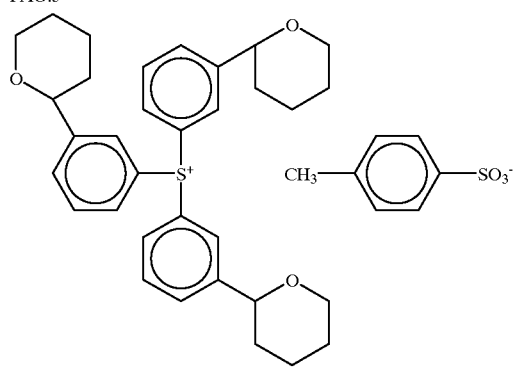
PAG.6
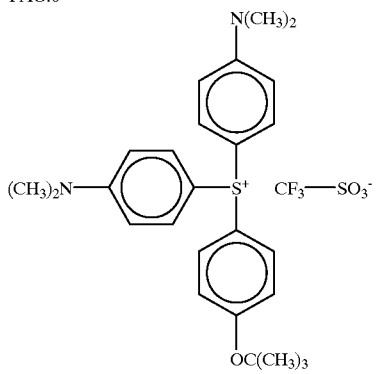
PAG.7
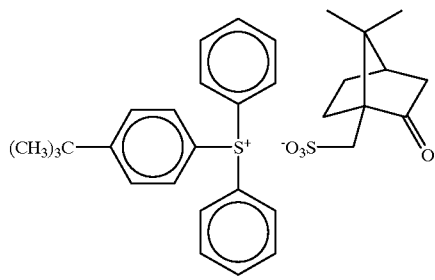
PAG.8
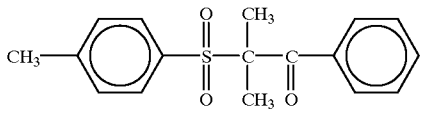
PAG.9
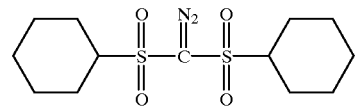
DRR.1
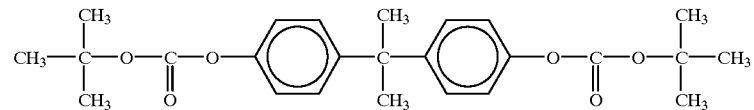
DRR.2
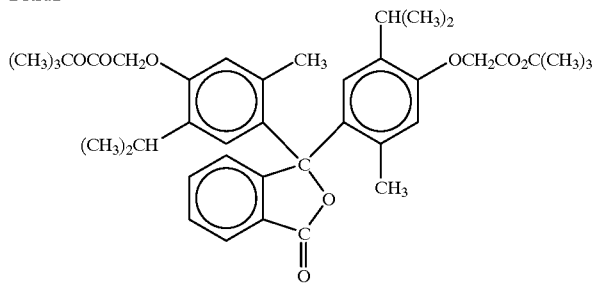
DRR.3
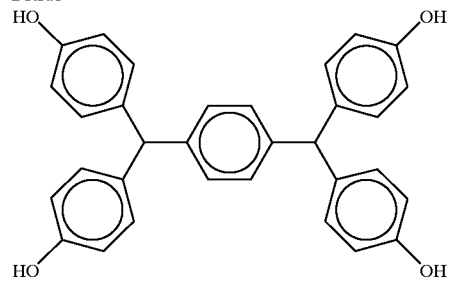
acid labile group: tert-butoxycarbonyl
average replacement: 50%
DRR.4
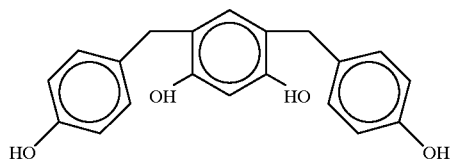
acid labile group: ethoxyethyl
average replacement: 50%
DRR.5
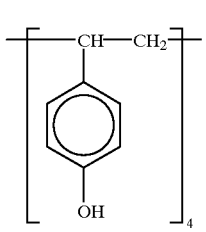
acid labile group: tert-butoxycarbonyl
average replacement: 50%

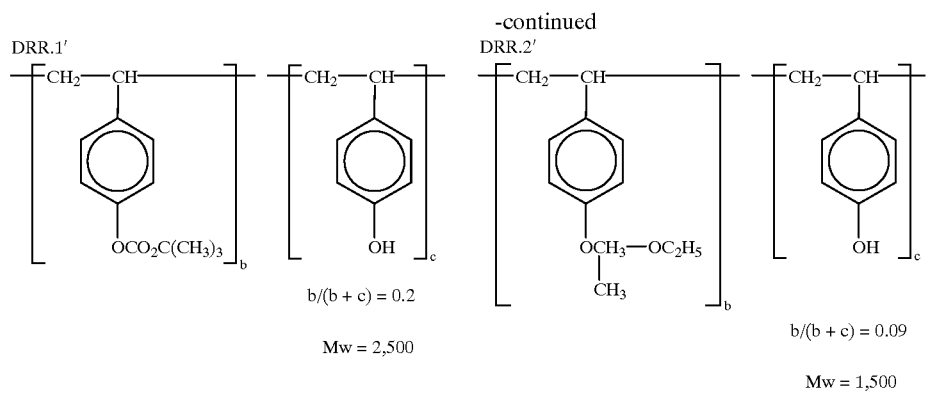

-continued b/(b + c) = 0.2
Mw = 2,500 b/(b + c) = 0.09
Mw = 1,500

TABLE 1

| Designation | Nitrogenous organic compound | pKa @25° C. | Vapor pressure (Torr) |
|---|---|---|---|
| a-1 | 1,8-diazabicycloundecene | 11.2 | 1 |
| a-2 | triethanolamine | 7.9 | 0.06 |
| a-3 | 1-naphthylamine | 9.5 | 0.8 |
| b-1 | quinoline | 9.5 | 9 |
| b-2 | 1-piperidine-ethanol | 9.5 | 26 |
| b-3 | triisobutylamine | 10.3 | 45 |
| b-4 | o-toluidine | 9.5 | 25 |
| b-5 | 1,5-diazabicyclononene | 11 | 8 |
| c-1 | pyridine | 5.2 | 470 |
| c-2 | N-methylaniline | 4.6 | 30 |
| c-3 | aniline | 4.6 | 45 |

TABLE 2

| | | Resist composition (pbw in parentheses) | | | | | | Lithographic test | | | |
|---|---|---|---|---|---|---|---|---|---|---|---|
| | | Nitrogenous organic compound | | | | | | | | 0.26 μm profile | |
| Example | Resin | a/mol of PAG | b/mol of PAG | c/mol of PAG | Photoacid generator | Dissolution rate regulator | Solvent | Sensitivity (mJ/cm$^2$) | Resolution (μm) | Initial | After 60 min. |
| 1 | Polym. 1 (80) | a-1 0.10 mol (0.12) | b-1 0.10 mol (0.10) | — | PAG. 1 (4) | — | PGMEA (336) | 40 | 0.20 | rectangular | I |
| 2 | Polym. 1 (80) | a-1 0.40 mol (0.48) | b-3 0.15 mol (0.22) | — | PAG. 1 (4) | — | PGMEA (336) | 85 | 0.20 | rectangular | I |
| 3 | Polym. 1 (80) | a-1 0.05 mol (0.06) | b-5 0.06 mol (0.06) | — | PAG. 1 (4) | DRR. 1 (10) | PGMEA (336) | 20 | 0.22 | rectangular | I |
| 4 | Polym. 1 (80) | a-2 0.13 mol (0.12) | b-2 0.10 mol (0.10) | — | PAG. 4 (4) | — | PGMEA (336) | 22 | 0.20 | rectangular | I |
| 5 | Polym. 1 (80) | a-2 0.26 mol (0.12) | b-2 0.05 mol (0.05) | — | PAG. 4 (2) | DRR. 1' (10) | PGMEA (336) | 35 | 0.22 | rectangular | I |
| 6 | Polym. 2 (80) | a-1 0.05 mol (0.06) | b-2 0.07 mol (0.05) | — | PAG. 3 (4) | — | PGMEA (336) | 30 | 0.20 | rectangular | I |
| 7 | Polym. 3 (80) | a-1 0.10 mol (0.12) | b-1 0.05 mol (0.05) | — | PAG. 1 (4) | — | PGMEA (336) | 33 | 0.20 | rectangular | I |
| 8 | Polym. 3 (80) | a-2 0.10 mol (0.18) | b-2 0.10 mol (0.15) | — | PAG. 1 (6) | — | PGMEA (336) | 23 | 0.20 | rectangular | I |
| 9 | Polym. 3 (80) | a-3 0.30 mol (0.51) | b-1 0.10 mol (0.15) | — | PAG. 9 (4) | DRR. 2 (10) | PGMEA (336) | 70 | 0.22 | rectangular | II |
| 10 | Polym. 3 (80) | a-2 0.30 mol (0.33) | b-4 0.15 mol (0.12) | — | PAG. 2 (4) | DRR. 4 (8) | PGMEA (336) | 55 | 0.20 | rectangular | II |

TABLE 3

| | | Resist composition (pbw in parentheses) | | | | | | Lithographic test | | | |
|---|---|---|---|---|---|---|---|---|---|---|---|
| | | Nitrogenous organic compound | | | | Dissolution | | | | 0.26 μm profile | |
| Example | Resin | a/mol of PAG | b/mol of PAG | c/mol of PAG | Photoacid generator | rate regulator | Solvent | Sensitivity (mJ/cm²) | Resolution (μm) | Initial | After 60 min. |
| 11 | Polym. 3 (80) | a-1 0.05 mol (0.07) a-2 0.05 mol (0.07) | b-3 0.06 mol (0.09) | — | PAG. 4 (6) | — | PGMEA (344) | 27 | 0.22 | rectangular | II |
| 12 | Polym. 4 (80) | a-2 0.10 mol (0.10) | b-5 0.10 mol (0.08) | — | PAG. 6 (1) PAG. 2 (3) | — | PGMEA (336) | 45 | 0.20 | rectangular | II |
| 13 | Polym. 4 (80) | a-2 0.10 mol (0.18) | b-3 0.05 mol (0.11) | — | PAG. 1 (6) | DRR. 2' (8) | PGMEA (344) | 40 | 0.22 | rectangular | II |
| 14 | Polym. 5 (80) | a-3 0.20 mol (0.25) | b-4 0.10 mol (0.09) | — | PAG. 5 (6) | — | PGMEA (344) | 33 | 0.20 | rectangular | II |
| 15 | Polym. 6 (80) | a-2 0.05 mol (0.08) | b-2 0.05 mol (0.07) | — | PAG. 2 (6) | — | PGMEA (344) | 51 | 0.24 | rectangular | II |
| 16 | Polym. 7 (80) | a-1 0.10 mol (0.11) | b-1 0.05 mol (0.05) | — | PAG. 2 (4) | DRR. 3 (8) | EL/BA (344) | 63 | 0.22 | rectangular | II |
| 17 | Polym. 7 (80) | a-2 0.10 mol (0.08) | b-1 0.05 mol (0.04) | — | PAG. 3 (4) | — | EL/BA (344) | 48 | 0.24 | rectangular | II |
| 18 | Polym. 7 (80) | a-2 0.05 mol (0.08) | b-2 0.05 mol (0.07) | — | PAG. 2 (6) | DRR. 2' (24) | PGMEA (440) | 48 | 0.22 | rectangular | I |
| 19 | Polym. 8 (80) | a-2 0.10 mol (0.11) | b-3 0.05 mol (0.07) | — | PAG. 2 (4) | DRR. 3 (16) | EL/BA (400) | 51 | 0.22 | rectangular | III |

TABLE 4

| | | Resist composition (pbw in parentheses) | | | | | | Lithographic test | | | |
|---|---|---|---|---|---|---|---|---|---|---|---|
| | | Nitrogenous organic compound | | | | Dissolution | | | | 0.26 μm profile | |
| Example | Resin | a/mol of PAG | b/mol of PAG | c/mol of PAG | Photoacid generator | rate regulator | Solvent | Sensitivity (mJ/cm²) | Resolution (μm) | Initial | After 60 min. |
| 20 | Polym. 8 (80) | a-3 0.10 mol (0.16) | b-2 0.05 mol (0.07) | — | PAG. 2 (6) | DRR. 4 (16) | EL/BA (408) | 42 | 0.22 | rectangular | III |
| 21 | Polym. 9 (80) | a-2 0.20 mol (0.39) | b-4 0.10 mol (0.14) | — | PAG. 8 (4) | — | EL/BA (336) | 67 | 0.22 | rectangular | I |
| 22 | Polym. 1 (40) Polym. 6 (40) | a-1 0.10 mol (0.11) | b-1 0.10 mol (0.09) | — | PAG. 7 (4) | — | PGMEA (336) | 43 | 0.24 | rectangular | I |
| 23 | Polym. 1 (60) Polym. 7 (20) | a-1 0.10 mol (0.12) | b-1 0.10 mol (0.10) | — | PAG. 1 (4) | DRR. 4 (16) | PGMEA (336) | 44 | 0.24 | rectangular | I |

I: rectangular, dimensional change ≦ 5%
II: rectangular, dimensional thinning 5%
III: rectangular, dimensional thickening 5%

I: rectangular, dimensional change ≦5%

II: rectangular, dimensional thinning 5%

III: rectangular, dimensional thickening 5%

TABLE 5

| | | Resist composition (pbw in parentheses) | | | | | | Lithographic test | | | |
|---|---|---|---|---|---|---|---|---|---|---|---|
| | | Nitrogenous organic compound | | | | | | | | 0.26 µm profile | |
| Comparative Example | Resin | a/mol of PAG | b/mol of PAG | c/mol of PAG | Photoacid generator | Dissolution rate regulator | Solvent | Sensitivity (mJ/cm$^2$) | Resolution (µm) | Initial | After 60 min. |
| 1 | Polym. 1 (80) | a-1 0.10 mol (0.12) | — | — | PAG. 1 (4) | — | PGMEA (336) | 8.5 | 0.22 | rectangular | VI |
| 2 | Polym. 1 (80) | — | b-1 0.10 mol (0.10) | — | PAG. 1 (4) | — | PGMEA (336) | 7.5 | 0.26 | IV | VII |
| 3 | Polym. 1 (80) | — | — | c-1 0.10 mol (0.07) | PAG. 1 (4) | — | PGMEA (336) | 5.0 | 0.26 | rectangular | VI |
| 4 | Polym. 1 (80) | — | — | c-2 0.10 mol (0.08) | PAG. 1 (4) | — | PGMEA (336) | 6.0 | 0.26 | rectangular | VI |
| 5 | Polym. 1 (80) | — | — | c-3 0.10 mol (0.07) | PAG. 1 (4) | — | PGMEA (336) | 5.5 | 0.26 | rectangular | VI |
| 6 | Polym. 1 (80) | a-1 0.10 mol (0.12) | — | c-1 0.10 mol (0.07) | PAG. 1 (4) | — | PGMEA (336) | 10.0 | 0.22 | rectangular | VI |
| 7 | Polym. 1 (80) | a-1 0.60 mol (0.72) | b-1 0.60 mol (0.60) | — | PAG. 1 (4) | — | PGMEA (336) | 110 | 0.24 | V | V |

IV: forward tapered, round line top
V: thinned line top
VI: T-top
VII: forward tapered There has been described a chemically amplified positive working resist composition which has satisfactory sensitivity and high resolution and forms a resist pattern of satisfactory geometry having improved dimensional control, plasma etching resistance and heat resistance.

Japanese Patent Application No. 111309/1996 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. A chemically amplified positive resist composition comprising
    (A) an organic solvent,
    (B) a base resin,
    (C) a photoacid generator, and
    (D) a mixture of (1) at least one nitrogenous organic compound having a pKa value of at least 7 and a vapor pressure of less than 2 Torr at 100° C. and (2) at least one nitrogenous organic compound having a pKa value of at least 7 and a vapor pressure of 2 to 100 Torr at 100° C.,
    said nitrogenous organic compound (1) being provided in an amount of 0.05 to 0.5 mol per mol of the photoacid generator and said nitrogenous organic compound (2) being provided in an amount of 0.01 to 1 mol per mol of the photoacid generator.

2. The chemically amplified positive resist composition of claim 1 further comprising (E) a dissolution rate regulator in the form of a compound having a weight-average molecular weight of 100 to 1,000 and at least two phenolic hydroxyl groups in a molecule, the hydrogen atom of the phenolic hydroxyl group being replaced by an acid labile group in an average proportion of 10% to 100% of the entire phenolic hydroxyl groups.

3. The chemically amplified positive resist composition of claim 1 further comprising (F) a dissolution rate regulator in the form of a compound having a weight-average molecular weight of more than 1,000 to 3,000 and a phenolic hydroxyl group in a molecule, the hydrogen atom of the phenolic hydroxyl group being partially replaced by an acid labile group in an average proportion of more than 0% to 60% of the entire phenolic hydroxyl groups.

4. The chemically amplified positive resist composition of claim 2 further comprising (F) a dissolution rate regulator in the form of a compound having a weight-average molecular weight of more than 1,000 to 3,000 and a phenolic hydroxyl group in a molecule, the hydrogen atom of the phenolic hydroxyl group being partially replaced by an acid labile group in an average proportion of more than 0% to 60% of the entire phenolic hydroxyl groups.

5. The chemically amplified positive resist composition of claim 1, wherein the nitrogenous organic compound (1) has a pKa value of 7.5 to 13 and a vapor pressure of 0 to 1.5 Torr at 100° C.

6. The chemically amplified positive resist composition of claim 1, wherein the nitrogenous organic compound (1) is 1,8-azabicycloundecene, triethanolamine, 1-naphthylamine, 2-napthylamine, diphenylamine, acetanilide, 3,6,9-triazaundecamethylenediamine, or 4,4'-propane-1,3-diylbismorpholine.

7. The chemically amplified positive resist composition of claim 1, wherein the nitrogenous organic compound (2) has a pKa value of 7.5 to 13 and a vapor pressure of 2 to 50 Torr at 100° C.

8. The chemically amplified positive resist composition of claim 1, wherein the nitrogenous organic compound (2) is quinoline, methylquinoline, dimethylquinoline, trimethylquinoline, tri-n-butylamine, triisobutylamine, trihexylamine, piperidine-ethanol, toluidine, 1,5-diazabicyclononene, benzenediamine, phenylpiperidine, indole, benzynepyrridine, dimethyltriazole, nitrophenol, diethanolamine, ethylanthranylate, dibutylethylenediamine, dimethylphenylenediamine, triethylenetetramine, iminodiethanol, ethoxyaniline, or phenylpropylhydrazine.

9. The chemically amplified positive resist composition of claim 1, wherein the organic solvent, (A), is provided in about 200 to 1000 parts by weight per 100 parts by weight of the base resin.

10. The chemically amplified positive resist composition of claim 1, wherein the base resin is a polymer of weight-average molecular weight from 3,000 to 300,000 and has recurring units of the formula (1):

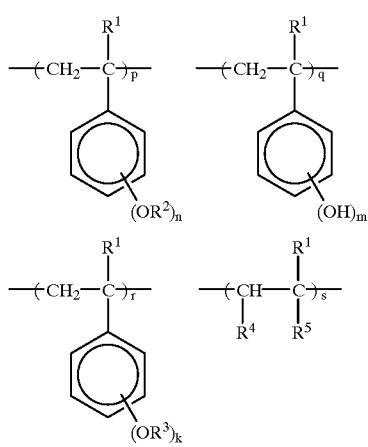

(1)

wherein $R^1$ is independently a hydrogen atom or methyl group, $R^2$ is a hydrogen atom or acid labile group, at least one $R^2$ being hydrogen and at least one $R^2$ being an acid labile group, $R^3$ is an acid labile group, $R^4$ is a hydrogen atom, and $R^5$ is —COOX or

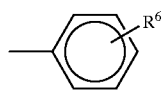

wherein X is a hydrogen atom or an acid labile group and $R^6$ is a hydrogen atom or an alkyl group having 1 to 6 carbon atoms, or alternatively, $R^4$ and $R^5$, taken together, form a

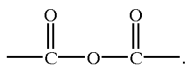

unit, letter n is equal to 2 or 3, each of letters m and k is equal to 1, 2 or 3, and letters p, q, r and s are 0 or a positive number with the proviso that p+q≠0 and p+r≠0.

11. The chemically amplified positive resist composition of claim 1, wherein the base resin is a monodisperse polymer having a dispersity of 1.0 to 1.5.

12. The chemically amplified positive resist composition of claim 1, wherein the photoacid generator, (B), is provided in about 1 to 20 parts by weight per 100 parts by weight of the base resin.

13. The chemically amplified positive resist composition of claim 10 wherein the acid labile group in $R^2$, $R^3$ and X is selected from the group consisting of compounds of the formulae (2) and (3); linear, branched or cyclic alkyl groups having 1 to 6 carbon atoms; tetrahydropyranyl; tetrahydrofuranyl; and trialkylsilyl groups;

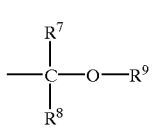

(2)

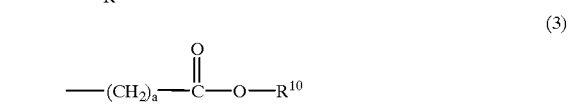

(3)

wherein $R^7$ and $R^8$ are independently a hydrogen atom or normal or branched alkyl group having 1 to 6 carbon atoms, $R^9$ is a normal, branched or cyclic alkyl group having 1 to 10 carbon atoms, $R^{10}$ is a normal, branched or cyclic alkyl group having 1 to 6 carbon atoms, and letter a is equal to 0 or 1.

14. The chemically amplified positive resist composition of claim 13 wherein the acid labile group in $R^2$, $R^3$ and X is a tert-butyl group, alkoxyalkyl group or tert-butoxycarbonyl group.

15. The chemically amplified positive resist composition of claim 1 wherein the photoacid generator is an onium salt, sulfonate, halogenated compound or triazine compound.

* * * * *